US008947842B2

(12) United States Patent
Feldtkeller

(10) Patent No.: US 8,947,842 B2
(45) Date of Patent: Feb. 3, 2015

(54) TEMPERATURE EVALUATION CIRCUIT

(75) Inventor: Martin Feldtkeller, Munich (DE)

(73) Assignee: Infineon Technologies Austria AG, Villach (AT)

( * ) Notice: Subject to any disclaimer, the term of this patent is extended or adjusted under 35 U.S.C. 154(b) by 533 days.

(21) Appl. No.: 13/226,934

(22) Filed: Sep. 7, 2011

(65) Prior Publication Data

US 2013/0057995 A1    Mar. 7, 2013

(51) Int. Cl.
*H02H 5/04* (2006.01)
*G01K 7/01* (2006.01)
*G01K 1/02* (2006.01)
*G01K 3/00* (2006.01)

(52) U.S. Cl.
CPC *G01K 7/01* (2013.01); *G01K 1/026* (2013.01); *G01K 3/005* (2013.01)
USPC .......................................... 361/103

(58) Field of Classification Search
CPC ......... H02H 3/08; H02H 3/085; H01H 1/504; H01H 37/32
USPC .......................................... 361/103
See application file for complete search history.

(56) References Cited

U.S. PATENT DOCUMENTS 7,454,640 B1 * 11/2008 Wong ............................. 713/324
8,009,418 B2 * 8/2011 Hosokawa ................ 361/679.52
8,203,315 B2 * 6/2012 Ladurner et al. ............... 320/150

* cited by examiner

*Primary Examiner* — Dharti Patel
(74) *Attorney, Agent, or Firm* — Slater & Matsil, L.L.P.

(57) ABSTRACT

An electronic circuit includes a temperature evaluation circuit. The temperature evaluation circuit includes a first sensor circuit with a first output terminal that is configured to sense a first temperature at a first position of the electronic circuit and to generate at the first output terminal a first output current that is dependent on the first temperature. A second sensor circuit includes a second output terminal and is configured to sense a second temperature at a second position of the electronic circuit and to generate at the second output terminal a second output current that is dependent on the second temperature. An evaluation circuit has an input terminal connected to the first output terminal and the second output terminal and is configured to provide an evaluation signal that is dependent on a current received at the input terminal.

24 Claims, 7 Drawing Sheets

TEMPERATURE EVALUATION CIRCUIT

TECHNICAL FIELD

Embodiments of the present invention relate to an electronic circuit including a temperature evaluation circuit. Particular embodiments relate to an electronic circuit including an integrated circuit and a temperature evaluation circuit configured to evaluate at least one temperature in the integrated circuit.

BACKGROUND

Integrated circuits may include a plurality of different semiconductor devices integrated in a semiconductor body. A failure, such as a short-circuit external to the integrated circuit, may cause electrical energy to be dissipated in one or in several of these devices in the semiconductor body and may, therefore, cause the temperature of the semiconductor body to increase. At the beginning, which is right after the failure occurs, the temperature increase is only local, namely at the position where the dissipating semiconductor device is located, while the region with the increased temperature expands when the failure is present for a longer time. In order to prevent the integrated circuit from being thermally overloaded at least one temperature sensor can be arranged in the integrated circuit. This temperature sensor provides a temperature signal that is representative of a temperature at the position where the temperature sensor is located. This temperature is evaluated, so as to be able to take suitable over temperature protection measures, such as switching off a part of the integrated circuit.

According to one approach, not only the temperature at one position, but also a temperature difference between the temperatures at two positions is measured and evaluated.

In integrated circuits with a plurality of different devices and a plurality of temperature sensors an evaluation circuit that is configured to evaluate the individual temperatures or temperature differences can be quite complex.

There is a need for a temperature evaluation circuit that is easy to implement and that can be easily adapted to specific needs.

SUMMARY OF THE INVENTION

A first embodiment relates to an electronic circuit including a temperature evaluation circuit. The temperature evaluation circuit includes a first sensor circuit and a second sensor circuit. The first sensor circuit includes a first output terminal and is configured to sense at least a first temperature at a first position of the electronic circuit and to generate at the first output terminal a first output current that is dependent on the first temperature. The second sensor circuit includes a second output terminal and is configured to sense at least a second temperature at a second position of the electronic circuit and to generate at the second output terminal a second output current that is dependent on the second temperature. The temperature evaluation circuit further includes an evaluation circuit having an input terminal connected to the first output terminal and the second output terminal and configured to provide an evaluation signal that is dependent on a current received at the input terminal.

A second embodiment relates to an electronic circuit including a temperature evaluation circuit. The temperature evaluation circuit includes a plurality of n sensor circuits, wherein n>1, each sensor circuit comprising an output terminal and configured to sense at least one temperature and to provide an output current that is dependent on the at least one temperature. The temperature evaluation circuit further includes an evaluation circuit comprising an input terminal connected to the output terminals of the plurality of the sensor circuits and configured to provide an evaluation signal that is dependent on a current received at the input terminal.

A third embodiment relates to a method for protecting a first power semiconductor device integrated in a semiconductor body in which a second power semiconductor device is integrated. The method includes providing a first temperature signal that is dependent on a temperature of the first power semiconductor device. A second temperature signal is dependent on a temperature of the second power semiconductor device. A weighted sum of at least the first temperature signal and the second temperature signal is formed so as to form a combined temperature signal. A first weighting factor of the first temperature signal and a second weighting factor of the second temperature signal have opposite signs. The method further includes comparing the combined temperature signal with a threshold value, and switching off the first power semiconductor device dependent on a comparison result.

BRIEF DESCRIPTION OF THE DRAWINGS

Examples will now be explained with reference to the drawings. The drawings serve to illustrate the basic principle, so that only aspects necessary for understanding the basic principles are illustrated. The drawings are not to scale. In the drawings the same reference characters denote like features.

FIG. 8 illustrates an embodiment of the current source arrangement according to

FIG. 7;

DETAILED DESCRIPTION OF ILLUSTRATIVE EMBODIMENTS

In the following detailed description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Embodiments of the present invention will be explained in a specific context, namely in context with sensing and evaluating temperatures in an integrated circuit. It should be noted, however, that embodiments of the invention are not restricted to sensing and evaluating temperatures in an integrated circuit, but may be applied to sensing an evaluating temperatures in any kind of electronic circuits, which also includes electronic circuits with a plurality of devices arranged on a printed circuit board (PCB).

Figure 1:
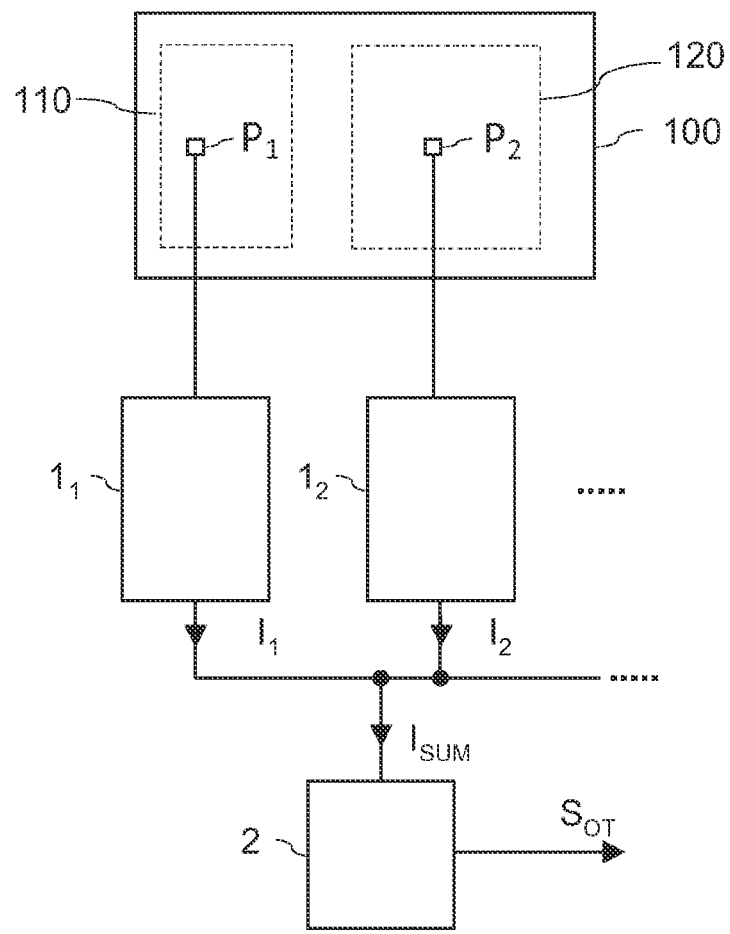
FIG. 1 illustrates a first embodiment of an electronic circuit including a temperature evaluation circuit having a plurality of sensor circuits.

FIG. 1 illustrates a first embodiment of an electronic circuit. The electronic circuit includes a temperature evaluation circuit with a plurality of n sensor circuits $1_1, 1_2$, wherein n>1. Although the electronic circuit illustrated in FIG. 1 includes n=2 sensor circuits $1_1, 1_2$, implementing the evaluation circuit with two sensor circuits $1_1, 1_2$ is only an example. In general, any number of sensor circuits may be implemented in the temperature evaluation circuit.

Each of the sensor circuits $1_1, 1_2$ is configured to measure a temperature at least at one position of the electronic circuit. In the embodiment illustrated in FIG. 1, a first sensor circuit $1_1$ of the plurality of sensor circuits is configured to sense a temperature at least at a first position $P_1$ of the electronic circuit, and a second sensor circuit $1_2$ of the plurality of sensor circuits is configured to sense a temperature at least at a second position $P_2$ of the electronic circuit. In the embodiment illustrated, the positions $P_1, P_2$ of the electronic circuit where the temperatures are sensed are positions of a semiconductor body 100 in which an integrated circuit is implemented. The temperature evaluation circuit with the plurality of sensor circuits $1_1, 1_2$ is thermally coupled to the semiconductor body 100. According to one embodiment, the temperature evaluation circuit, which is schematically illustrated in FIG. 1, is also integrated in the semiconductor body 100.

According to one embodiment, the integrated circuit implemented in the semiconductor body 100 includes at least one power semiconductor device, such as a power transistor, such as a power MOSFET or a power IGBT. This power device, however, is not illustrated in detail in FIG. 1. It is commonly known that power transistors can be used as electronic switches for switching electronic loads. When the power transistor is switched on and an error, such as a short-circuit, occurs in the load, electrical power is dissipated in the semiconductor body 100 at the position where the power transistor is integrated. This may result in an increase of the temperature of the semiconductor body 100 at the position where the power transistor is integrated and may result in a destruction of the power transistor having the faulty load connected thereto and/or in a malfunction of destruction of other semiconductor devices integrated in the semiconductor body 100. There is therefore a need to detect over temperatures that may occur in the semiconductor body 100 in order to be able to take suitable measures, such as switching off the power transistor or otherwise interrupting a power supply to the load before hazardous operation scenarios of the integrated circuit may occur.

Referring to FIG. 1, the first position $P_1$ and the second position $P_2$ are arranged distant. According to one embodiment, the second position $P_2$ is located within a power device area 120 of the semiconductor body 100. In the power device area 120 a high-voltage or high-current power semiconductor device, such as a power transistor, is integrated. This power semiconductor device can be a conventional power semiconductor device, which is not explicitly illustrated in FIG. 1. The first position $P_1$ is, for example, located outside and distant to the power device area 120. According to one embodiment, the first position $P_1$ is located in a logic area 110 of the semiconductor body 100. In the logic area 110 logic devices or low-voltage or low-current devices are implemented. These low-voltage devices are, for example, devices for controlling and driving the high-voltage power device integrated in the power device area 120. According to one embodiment, the temperature evaluation circuit is integrated in the logic area 110.

Each of the sensor circuits $1_1, 1_2$ is configured to provide an output current $I_1, I_2$ at an output terminal. These output currents $I_1, I_2$ are dependent on the at least one temperature sensed by the individual sensor circuit $1_1, 1_2$ so that a first output current $I_1$ of the first sensor circuit $1_1$ is dependent on the at least one temperature sensed by the first sensor circuit $1_1$, and a second output current $I_2$ is dependent on the at least one temperature sensed by the second sensor circuit $1_2$. The output currents $I_1, I_2$ are each provided to one input terminal of an evaluation circuit 2, so that the evaluation circuit 2 receives an input current $I_{SUM}$ that corresponds to the sum of the individual output currents $I_1, I_2$ of the sensor circuits $1_1, 1_2$. The evaluation circuit 2 is configured to evaluate the input current $I_{SUM}$ and to provide an overtemperature signal $S_{OT}$ dependent on the input current $I_{SUM}$. According to one embodiment, the overtemperature signal $S_{OT}$ may assume one of two different signal levels, namely a first signal level indicating a normal operation of the electronic circuit, and a second signal level indicating that an overtemperature in the electronic circuit has been detected. The overtemperature signal $S_{OT}$ can be received by a control or protection circuit (not illustrated in FIG. 1) that is configured to take suitable measures to protect the electronic circuit in case of an overtemperature scenario. These measures may, for example, include switching off the power device that has been detected to be overheated and/or switching off a power supply of the overall electronic circuit.

In the temperature evaluation circuit of FIG. 1, the overtemperature signal $S_{OT}$ is generated based on the input current $I_{SUM}$ which is again dependent on the first output current $I_1$ representing the at least one temperature sensed by the first sensor circuit $1_1$ and on the second output current $I_2$ representing the at least one temperature sensed by the second sensor circuit $1_2$. The input current $I_{SUM}$ therefore, represents a weighted sum of the at least one temperature sensed by the first sensor circuit $1_1$ and the at least one temperature sensed by the second sensor circuit $1_2$.

A temperature evaluation circuit of the type illustrated in FIG. 1 is very flexible. By simply connecting one or more additional sensor circuits each sensing at least one temperature at further positions of the semiconductor body 100 to the input terminal of the evaluation circuit 2, additional temperatures occurring in the integrated circuit may be taken into account in the generation of the overtemperature signal $S_{OT}$. The weight of each of these temperatures in the input current $I_{SUM}$ is, for example, adjusted in the sensor circuits $1_1, 1_2$ through a relationship (proportionality factor) between the at least one sensed temperature and the individual output current $I_1, I_2$. Examples of means for adjusting this relationship will be explained below.

Figure 2:
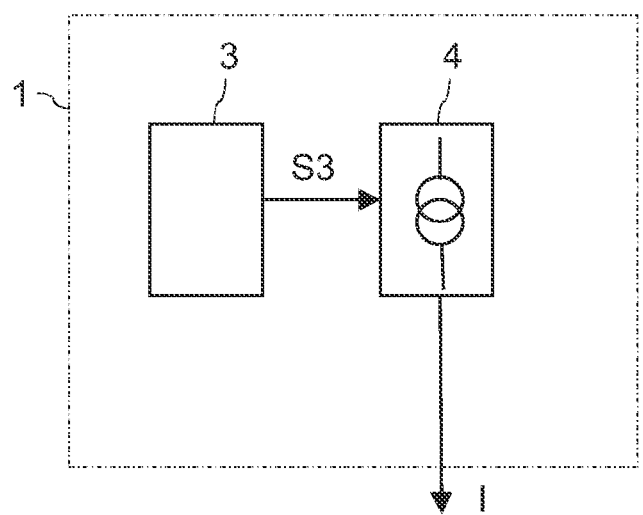
FIG. 2 illustrates a first embodiment of one sensor circuit.

FIG. 2 schematically illustrates a first embodiment of one of the sensor circuits $1_1$, $1_2$. The sensor circuit 1 illustrated in FIG. 2 represents one of the plurality of sensor circuits $1_1$, $1_2$, where each of the plurality of sensor circuits $1_1$, $1_2$ may be implemented as illustrated in FIG. 2. However, it is also possible to implement the individual sensor circuits $1_1$, $1_2$ in different ways.

Referring to FIG. 2, the sensor circuit 1 includes a temperature sensor 3 that is thermally coupled to the at least one position P of the semiconductor body 100 at which the sensor circuit 1 senses the at least one temperature. The position discussed with respect to FIG. 2 represents one of the positions $P_1$, $P_2$ illustrated in FIG. 1.

The temperature sensor 3 provides a temperature signal S3, where the temperature signal S3 represents at least one temperature at the position P. The temperature signal S3 is received by a current source arrangement 4. The current source arrangement 4 is configured to generate the output current I of the sensor circuit 1 dependent on the temperature signal S3 and, therefore, dependent on the at least one sensed temperature at the position P. The output current I in FIG. 2 represents one of the output currents $I_1$, $I_2$ of FIG. 1.

Figure 3:
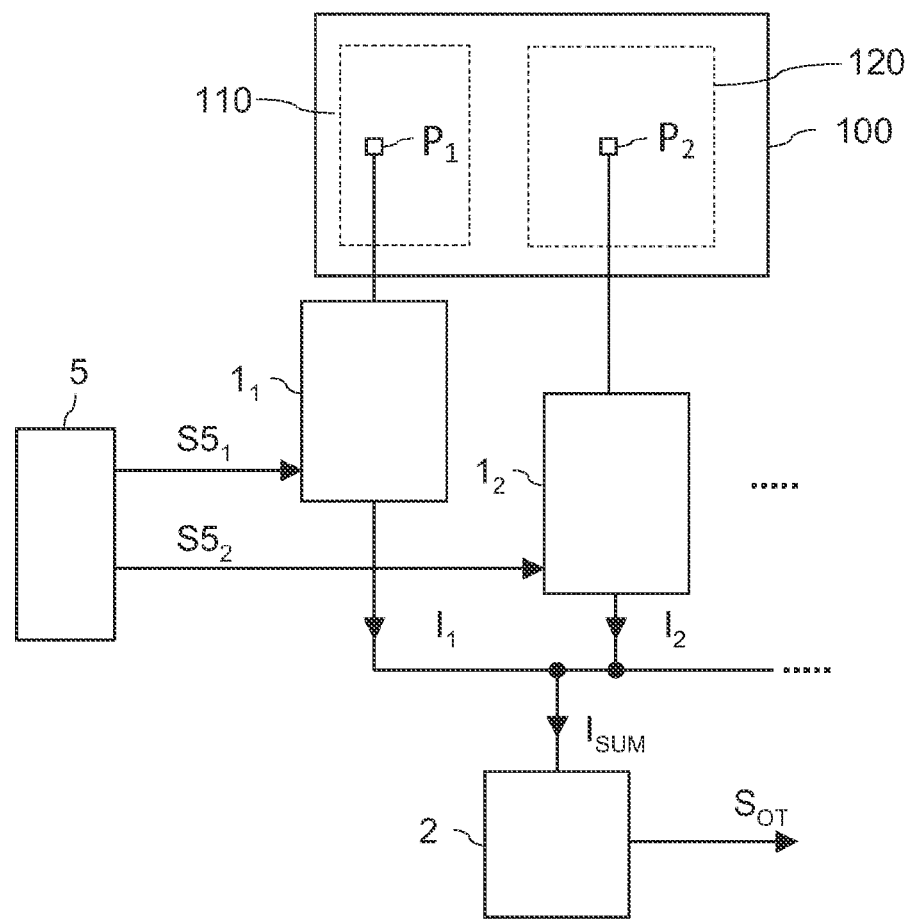
FIG. 3 illustrates a further embodiment of an electronic circuit including a temperature evaluation circuit with a plurality of sensor circuits.
Figure 10:
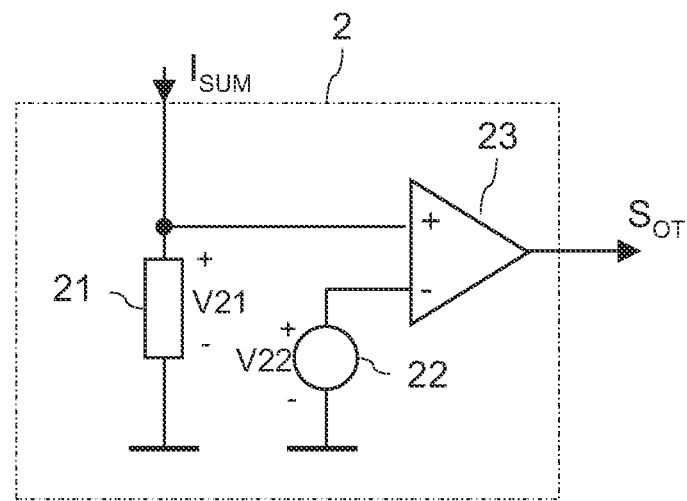
FIG. 10 illustrates a further embodiment of a current source arrangement that may be implemented in a sensor circuit.

FIG. 3 illustrates a further embodiment of an electronic circuit including a temperature evaluation circuit. The temperature evaluation circuit of FIG. 3 is based on the temperature evaluation circuit of FIG. 1 and additionally includes a control circuit 5 that is configured to generate at least one control signal $S5_1$, $S5_2$ received by one sensor circuit $1_1$, $1_2$. In the embodiment illustrated in FIG. 3, the control circuit 5 is configured to generate a control signal $S5_1$, $S5_2$ for each of the sensor circuits $1_1$, $1_2$. However, this is only an example. The control circuits $1_1$, $1_2$ are configured to adjust the relationship between the at least one sensed temperature and the respective output current $I_1$, $I_2$ dependent on the control signal $S5_1$, $S5_2$ received from the control circuit 5. The control signals $S5_1$, $S5_2$ therefore define the weight of the individual temperatures as sensed by the sensor circuits $1_1$, $1_2$ in the input current $I_{SUM}$ of the evaluation circuit 2. Besides the weight of the individual temperatures the control signals $S5_1$, $S5_2$ do also define the "effective threshold" with which the input current $I_{SUM}$ of the evaluation circuit 2 is compared with. When, for example, the control signals $S5_1$, $S5_2$ vary only such that their sum is constant, only the weight of the individual output current varies. When however, also the sum of the control signals $S5_1$, $S5_2$ varies, the effective threshold also varies. This will be explained in further detail below in connection with FIG. 10.

The control signals $S5_1$, $S5_2$ can be fixed signals that do not change during operation of the electronic circuit. In this case, the control circuit 5 is, for example, implemented as a one time programmable (OTP) memory that generates the control signal $S5_1$, $S5_2$ dependent on information stored therein. Through the control circuit 5, the electronic circuit can be configured dependent on specific needs or dependent on the characteristic of electronic devices implemented in the electronic circuit or the temperature evaluation circuit. The characteristic of these individual devices may vary dependent on the relations in a manufacturing process. By suitably selecting the control signals $S5_1$, $S5_2$ such variations may be compensated.

According to a further embodiment, the control signals $S5_1$, $S5_2$ may vary during operation of the electronic circuit in order to vary the weight of the individual output currents $I_1$, $I_2$. According to one embodiment, the control signals $S5_1$, $S5_2$ are varied dependent on an "operation history" of the at least one of the power device. The operation history may, e.g., include information on the time period for which the power device has been switched on, or whether an overtemperature scenario of the power device has been detected before. Varying the control signals $S5_1$, $S5_2$ during operation further allows, for example, to evaluate at one time only one of the temperatures sensed by one sensor circuit $1_1$, $1_2$ by, for example, setting the weight of the other temperature in the input current $I_{SUM}$ to zero.

Figure 4:
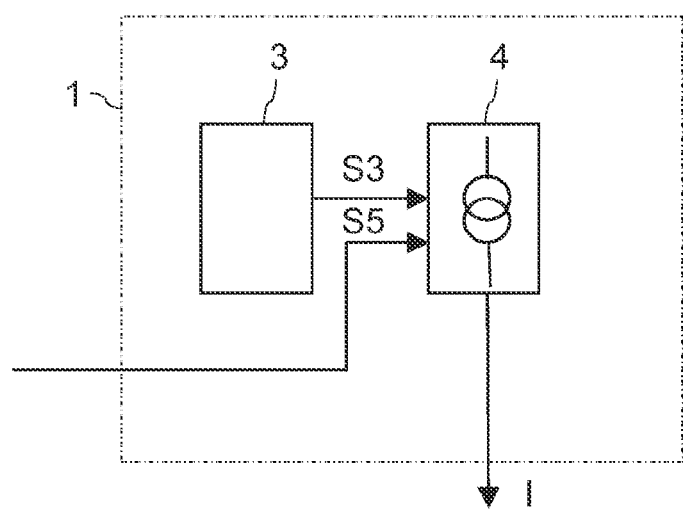
FIG. 4 illustrates a further embodiment of one sensor circuit.

FIG. 4 illustrates an embodiment of a sensor circuit 1 that can be used to implement one or more sensor circuits $1_1$, $1_2$ illustrated in FIG. 3. In this sensor circuit 1, the current source arrangement 4 receives the control signal S5, where S5 in FIG. 4 represents the control signal received by the individual sensor circuit, such as the first control signal $S5_1$ received by the first sensor circuit $1_1$ or the second control signal $S5_2$ received by the second sensor circuit $1_2$. The current source arrangement 4 is configured to adjust the output current I dependent on the temperature signal S3 and also dependent on the control signal S5.

The temperature sensor 3 implemented in the sensor circuits 1 illustrated in FIGS. 2 and 4 can be implemented as a conventional temperature sensor that is configured to generate a temperature signal S3 that is dependent on at least one temperature. According to one embodiment, the temperature sensor 3 is implemented as an absolute temperature sensor that generates a temperature signal S3 that is dependent or even proportional to the absolute temperature at a position where a temperature is to be sensed. Different implementations of such absolute temperature sensors are known.

Figure 5:
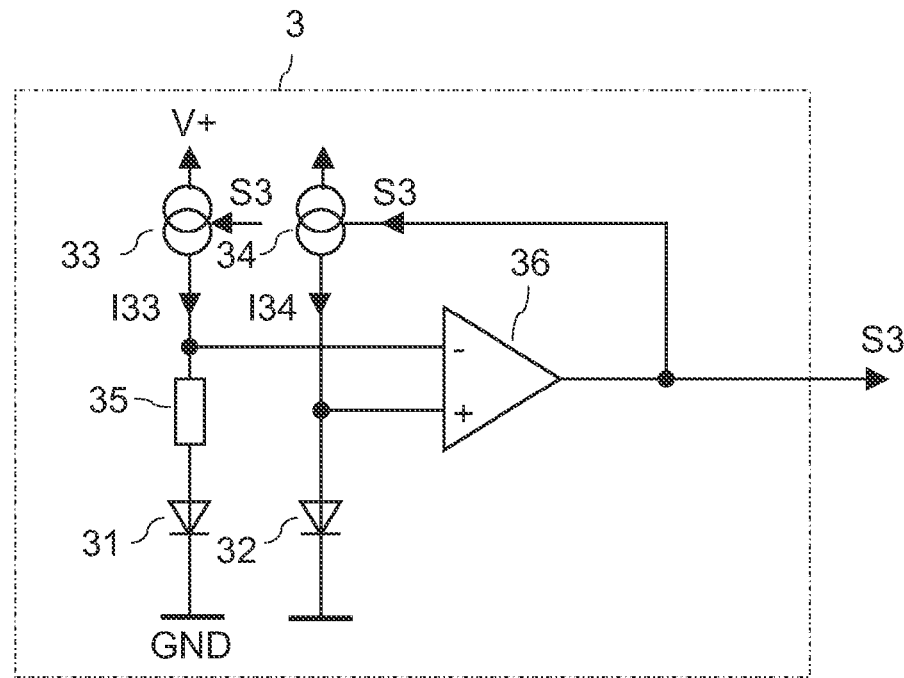
FIG. 5 illustrates a first embodiment of a temperature sensor that may be implemented in a sensor circuit.

One embodiment of such an absolute temperature sensor is illustrated in FIG. 5. This temperature sensor 3 includes two sensor elements 31, 32 which are each arranged at a position where a temperature is to be sensed. Assume, for example, that the temperature sensor 3 of FIG. 5 is implemented in the first sensor circuit $1_1$ according to FIGS. 1 and 3 which senses the temperature at a first position $P_1$ of the semiconductor body 100. In this case, the first and second sensor elements 31, 32 are arranged on the semiconductor body 100 or in the semiconductor body 100 at the first position $P_1$. Referring to FIG. 5, the sensor elements 31, 32 are implemented as diodes that are forward biased. The first sensor element 31 is connected in series with a first current source 33, where the series circuit with the first sensor element 31 and the first current source 33 is connected between terminals for a positive supply potential V+ and a negative supply potential or reference potential GND, respectively. The first series circuit with the first sensor element 31 and the first current source 33 further includes an impedance 35, such as a resistor, connected between the first sensor element 31 and the current source 33. The second sensor element 32 is connected in series with a second current source 34, where a second series circuit with the second sensor element 32 and the second current source 34 is connected between the terminals for the positive supply potential V+ and the reference potential GND.

In the following discussion, the terminology Ixx and Vxx is used, where xx is the reference numeral for an element in the circuit. In this nomenclature, Ixx refers to the current through the circuit element xx and Vxx refers to the voltage across the circuit element xx.

The first and second current source 33, 34 are controlled current sources that are controlled by a common control signal, which is the temperature signal S3 in the embodiment of FIG. 5. Although currents I33, I34 provided by the first and second current source 33, 34 are dependent on the temperature signal S3, the first and second current I33, I34 are proportional, so that a ratio I34/I33 is constant. The second current source 34 is, for example, implemented such that the second current I34 is greater than the first current I33, so that I34/I33>1.

The temperature signal S3 is generated by an amplifier, such as an operational amplifier (OA) that receives a voltage V31+V35 across the series circuit with the first sensor element 31 and the resistor 35 and a voltage V32 across the second sensor element 32. The amplifier 36 controls the first and second current source 33, 34 such that the voltage V31+V35 across the series circuit with the first sensor element 31 and the resistor 35 corresponds to the voltage V32 across the second sensor element 32. There are the following relationships between the first and second currents I33, I34 and the voltages V31, V32 across the second sensor elements 31, 32 and between the voltage V35 across the resistor and the voltages V32, V33 across the first and second sensor elements:

$$I33 = I_0 \cdot e^{q \frac{V31}{k \cdot T}}, \quad (1)$$

$$I32 = I_0 \cdot e^{q \frac{V32}{k \cdot T}}, \quad (2)$$

$$V35 = V32 - V31. \quad (3)$$

Using equations (1)-(3) it can be shown that the voltage V35 across the resistor is proportional to the absolute temperature T at the first and second sensor elements 31, 32 as follows:

$$V35 = \frac{k \cdot T}{q} \cdot \ln\left(\frac{I34}{I33}\right). \quad (4)$$

In equations (1)-(4) k is the Boltzmann constant, q is the elementary charge and T is absolute temperature at the position where the first and second sensor elements 31, 32 are located. Assume that 35 is a resistor having a resistance R35. In this case, the first current I33 is given as:

$$I33 = \frac{V35}{R35} = \frac{k \cdot T}{q \cdot R35} \cdot \ln\left(\frac{I34}{I33}\right). \quad (5)$$

Thus, the first current I33 is proportional to the absolute temperature T. In equation (5) k, q, R35 as well as the ratio I34/I33 are each constant.

Although, the first current I33 is proportional to the absolute temperature T, the temperature signal S3 provided by the temperature sensor 3 is not necessarily proportional to the absolute temperature T. However, a current that is proportional to the absolute temperature T can easily be generated by providing the temperature signal S3 to a current source of the same type as the first current source in the temperature sensor 3, or by simply coupling a current minor to the first current source 33. According to one embodiment a sensor circuit that includes a temperature sensor 3 as illustrated in FIG. 5 includes a current source arrangement which includes at least one current source of the same type as the first current source 33 of the temperature sensor 3.

Figure 6:
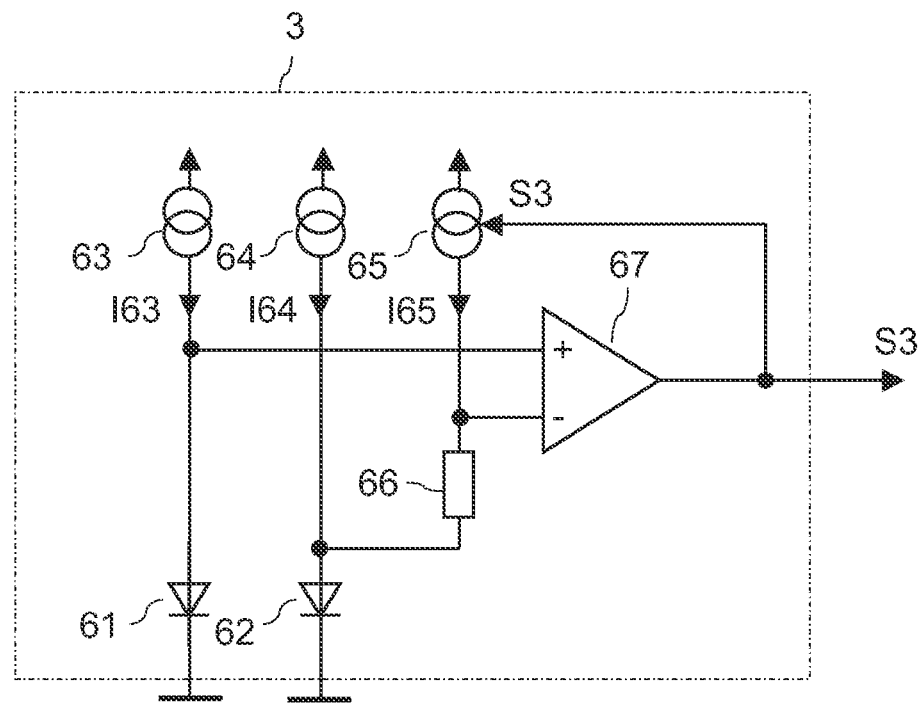
FIG. 6 illustrates a second embodiment of a temperature sensor that may be implemented in a sensor circuit.

FIG. 6 illustrates a further embodiment of a temperature sensor 3. This temperature sensor is implemented as a difference temperature sensor that is configured to measure the temperature at two different positions and to provide a temperature signal S3 that is dependent on a difference temperature ΔT between temperatures at these two positions. The temperature sensor 3 according to FIG. 6 includes a first series circuit with a first sensor element 61 and a first current source 63, a second series circuit with a second sensor element 62 and a second current source 64, and a third series circuit with a third current source 65 and an impedance 66, such as a resistor. The first and second series circuits are each connected between terminals for a positive supply potential V+ and reference potential GND. The third series circuit is connected between a terminal for the positive supply potential V+ and a circuit node common to the second sensor element 62 and the second current source 64. The first and second current sources 63, 64 provide first and second currents I63, I64 respectively. These currents can be identical, so that I163=I64, or can be different from each other. The third current source 65 is a controlled current source that receives the temperature signal S3 as a control signal. The temperature signal S3 is provided by an amplifier 67, such as an operational amplifier (OA) that receives a voltage V61 across the first sensor element 61 at a first terminal, and a voltage V62+V66 across the series circuit with the second sensor element 62 and the resistor 66 at a second terminal. The amplifier 67 controls the output current I65 of the third current source 65 such that the voltage V62+V66 across the series circuit with the second sensor element 62 and the resistor 66 equals the voltage V61 across the first sensor element 61. In this case, relationships between the first, second and third currents I63, I64, I65 provided by the first, second and third current sources and the voltages V61, V62 across the first and second sensor elements 61, 62, respectively and the voltage V66 across the resistor 66 are as follows:

$$I63 = I_0 \cdot e^{q \frac{V61}{k \cdot T1}}, \quad (6)$$

$$I64 = I_0 \cdot e^{q \frac{V62}{k \cdot T1}}, \quad (7)$$

$$V66 = V61 - V62. \quad (8)$$

In equations (6)-(8) q is the elementary charge, k is the Boltzmann consent, T1 is the absolute temperature at the position of the first sensor element 61 and T2 is the absolute temperature at the position of the second sensor element 62. Based on equations (6)-(8) and based on the assumption that the first and second currents are equal it can be shown that a voltage V66 across the resistor 66 is proportional to the temperature difference:

$$V66 = \frac{k \cdot \Delta T}{q} = \frac{k \cdot (T2 - T1)}{q}. \quad (9)$$

In equation (9), ΔT is the difference between a temperature at a position of the second sensor element 62 and the temperature at position of the first sensor element 61. Referring to equation (9) it can be shown that the third current I65 is proportional to the temperature difference ΔT as follows:

$$I65 = \frac{V66}{R65} = \frac{k \cdot \Delta T}{q \cdot R66}, \quad (10)$$

where R66 is the resistance of the resistor 66.

Thus, the temperature signal S3 of the temperature sensor 3 according to FIG. 6 that adjusts the third current I65 provided by the third current source 65 is dependent on the temperature difference ΔT. Although, the temperature signal S3 is not necessarily proportional to the temperature difference ΔT, a current that is proportional to this temperature difference ΔT can easily be generated by providing the temperature signal S3 to a current source of the same type as the third current source 65, or by coupling a current minor to the third current source.

Referring to equation (10), the third current I65 is zero when the temperature difference ΔT is zero, which is when the temperatures at the positions of the first and second sensors are equal. It should be noted in this connection, that the first and second sensors 61, 62 implemented in the temperature sensor of FIG. 6, as well as the first and second sensors implemented in the temperature sensor of FIG. 5, are identical so that voltages across these sensors are identical when subject to the same current. Equation (10) has been derived based on the assumption that the first and second currents I61, I62 are identical.

When the first and second currents are not identical, the third current is not zero when the temperature difference ΔT is zero. When, for example, the second current I64 is smaller than the first current I63, the third current I65$_0$ at ΔT=0 is:

$$I65_0 = \frac{kT}{q} \ln\left(\frac{I63}{I64}\right), \tag{11}$$

where T is the temperature at the position of the first temperature sensor. A third current I65 representing the temperature difference ΔT and being different from zero at ΔT=0 is equivalent to a temperature offset of T·ln(I63/I64) of the temperature difference represented by the third current.

When, however, the second current I64 is higher than the first current I63, the third current is zero, until the temperature at the position the second sensor element 62 has increased to T·ln(I64/I63) above the temperature at the position of the first sensor element 61.

Figure 7:
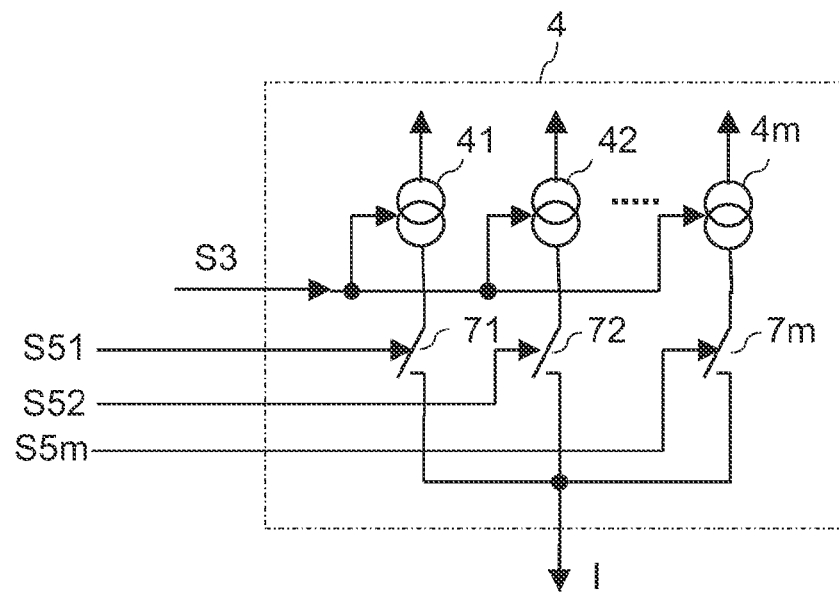
FIG. 7 illustrates a first embodiment of a current source arrangement that may be implemented in a sensor circuit.

FIG. 7 illustrates a first embodiment of a current source arrangement 4 that can be implemented in the sensor circuits $1_1$, $1_2$ together with one of the temperature sensors 3 as illustrated in FIG. 5. Referring to FIG. 7, the current source arrangement 4 includes a plurality of current sources 41, 42, 4m connected in parallel. These current source 41, 42, 4m are configured to be activated and deactivated dependent on the control signal S5 received by the current source arrangement 4. In this embodiment, the control signal 5 includes a plurality of subsignals S51, S52, S5m, where each of these subsignals is configured to activate or deactivate one of the current sources 41, 42, 4m. For activating or deactivating the current sources 41, 42, 4m, the current source arrangement 4 includes a plurality of switches 71, 72, 7m, where each of these switches is connected in series with one of the current source 41, 42, 4m and receives one of the subsignals S51, S52, S5m. A current source of the plurality of current sources 41, 42, 4m is activated when the corresponding switch 71, 72, 7m is switched on (closed), and a current source is deactivated, when the corresponding switch is switched off (is open). It should be noted, that providing a switch connected in series with a current source for activating or deactivating a current source is only one example. Of course, other means for activating or deactivating current sources dependent on signals, such as the subsignals S51, S52, S5m according to FIG. 7, may be implemented as well. The individual current sources 41, 42, 4m are of the same type as the first and second current sources 33, 34 of FIG. 5 when the current source arrangement 4 of FIG. 7 is used in connection with a temperature sensor 3 according to FIG. 5. When the current source arrangement 4 according to FIG. 7 is used together with a temperature sensor 3 according to FIG. 6, the individual current sources 41, 42, 4m of the current source arrangement 4 are of the same type as the third current source 65 of the temperature sensor 3 according to FIG. 6. To have the current sources 41, 42, 4m of the current source arrangement 4 to be of the same type as a current source in a temperature sensor 3 means that output currents I41, I42, I4m of the individual current sources 41, 42, 4m of the current source arrangement 4 are proportional to an output current of the current source in the temperature sensor 3, such as the first and second current sources 33, 34 of FIG. 5 or the third current source 65 of FIG. 6.

Instead of controlling the individual current sources 41, 42, 4m of the current source arrangement 4 with the same control signal as the current source(s) in the temperature sensor 3, the current sources 41, 42, 4m of the current source arrangement could also be part of a current minor coupled to the current source(s) in the temperature sensor 3. The signal S3 is in this case an internal current mirror signal.

According to one embodiment, the currents I41, I42, I4m provided by the individual current sources 41, 42, 4m are identical. In this case, the output current I of the current source arrangement 4 can be varied by varying the number of current sources that are activated. Assume, for example, that an output current of each of the current sources is I40, so that I41=I42=I4m=I40. In this case, the output current I of the current source arrangement 4 can be varied between 0 and m·I40, where m is the number of current sources connected in parallel. Since the output current of each of the current sources 41, 42, 4m is proportional to the absolute temperature T when used in connection with an absolute temperature sensor 3 of FIG. 5 or is proportional to the temperature difference ΔT when used in connection with the difference temperature sensor 3 of FIG. 6, a proportionality factor between the absolute temperature T or the difference temperature ΔT and the output current I of the current source arrangement 4 can be adjusted through the control signal S5 by varying the number of current sources that are activated.

According to a further embodiment, the current sources 41, 42, 4m are implemented such that they provide different output currents. In this case, the output current I is not only dependent on the number of current sources that are activated but is only dependent on which of the current sources are activated. According to one embodiment, the current source arrangement 4 includes m current sources each having an individual order number between 1 and m, and each of these current sources provides an output current according to I40·2$^{(i-1)}$, where i represents the order. Assume, for example, that current source 41 has order number 1 and provides an output current I41=I40, and that current source 4m has order number m and provides an output current I40·2$^{m-1}$. In this embodiment, by varying the current sources that are activated or deactivated, the output current I can be varied between i=I40 and I=I40·(2$^m$−1) in steps of I40. Thus, the proportionality factor between the absolute temperature and the temperature difference, respectively, in the output current I can be varied in a wide range.

Figure 8:
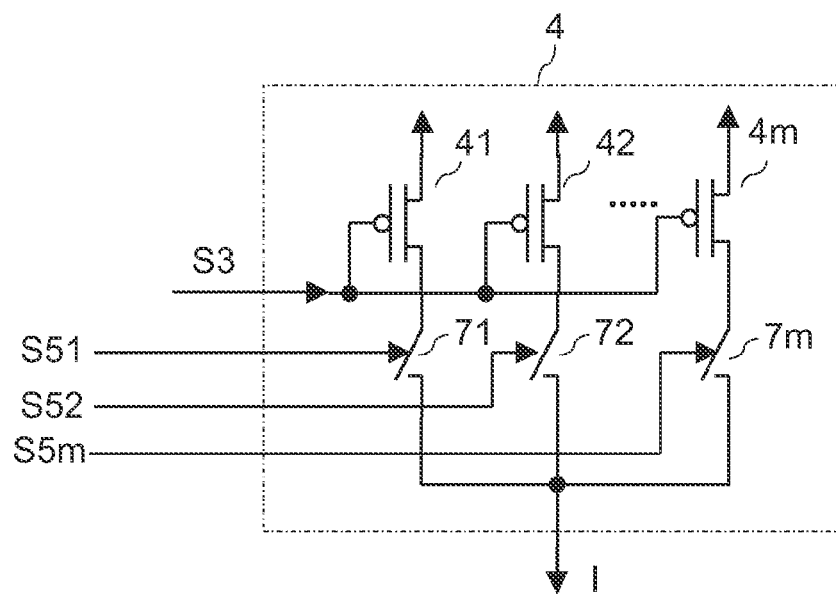

FIG. 8 illustrates an embodiment of the current source arrangement 4 of FIG. 7. In this embodiment, the individual current sources 41, 42, 4m are implemented as p-type MOSFETs that have their load paths connected in parallel and that each receive the temperature signal S3 at a control terminal (gate terminal). In the embodiment according to FIG. 8, the transistors are implemented as MOSFETs. However, this is only an example. The transistors could also be implemented as other types of transistors, such as IGBTs or bipolar junction transistors (BJTs).

The transistors 41, 42, 4m can be implemented to have identical transistor sizes (active areas). In this case, the output currents of the individual transistors are identical. The transistors can also be implemented to have different active areas. In this case, the output currents of the individual currents sources are different, where a relationship between the output currents of the transistors is dependent, in particular proportional to the ratio between the transistor sizes, where the transistor having the larger transistor size provides a higher output current.

When the current source arrangement 4 is implemented with p-type transistors, such as the current source illustrated in FIG. 8, the current sources in the temperature sensors, such as in the temperature sensors 3 illustrated in FIGS. 5 and 6 are also implemented as p-type transistors.

Figure 9:
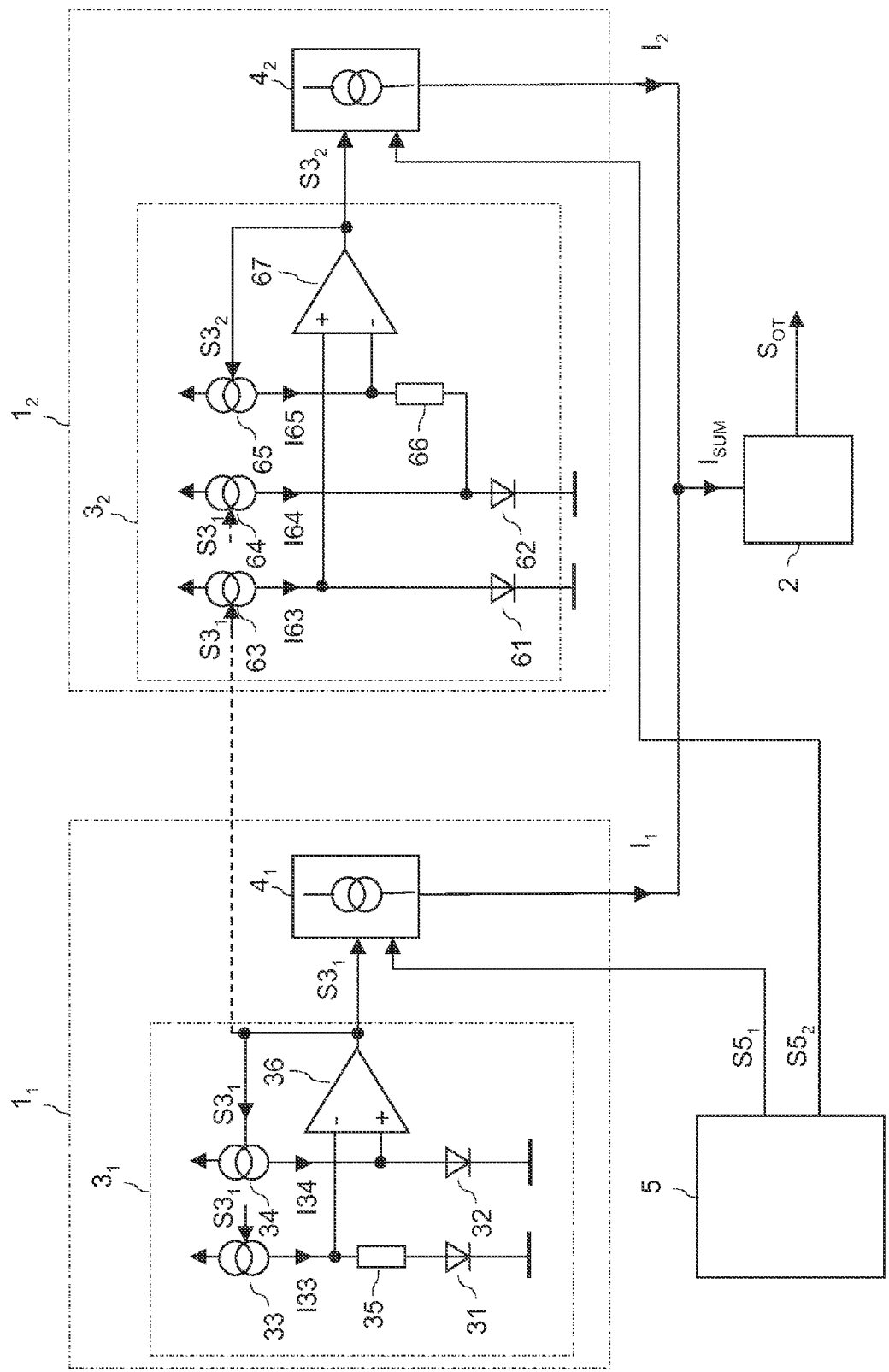
FIG. 9 illustrates an embodiment of a temperature evaluation circuit with two sensor circuits, a control circuit and an evaluation circuit.

FIG. 9 illustrates an embodiment of a temperature evaluation circuit in which the first sensor circuit $1_1$ is implemented with an absolute temperature sensor $3_1$ and the second sensor circuit $1_2$ is implemented with a difference temperature sensor $3_2$. The absolute temperature sensor $3_1$ of FIG. 9 is implemented like the temperature sensor of FIG. 5, and the difference temperature sensor $3_2$ is implemented like the difference temperature sensor of FIG. 6. However, this is only an example. Other types of absolute temperature sensors and different temperature sensors could be used as well.

The temperature sensor $3_1$ of the first circuit $1_1$ will be referred to as first temperature sensor, and the temperature sensor $3_2$ of the second sensor circuit $1_2$ will be referred to as second temperature sensor in the following. According to one embodiment, the first and second sensor elements 31, 32 of the first temperature sensor $3_1$ are located at the first position $P_1$ of the semiconductor body 100 (see FIG. 1), wherein the first position $P_1$ is arranged distant to the power device area 120. The second temperature sensor $3_2$ measures the temperature difference $\Delta T$ between the temperatures at two different positions of the semiconductor body 100. According to one embodiment, the second sensor 62 is arranged within the power device area 120, so as to measure the temperature within the power device area, while the first temperature sensor 61 of the second temperature sensor $3_2$ is arranged distant to the power device area 120. According to one embodiment, the first sensor 61 of the second temperature sensor $3_2$ is arranged at the first position $P_1$, which is the position of the first and second sensor elements 31, 32 of the first temperature sensor $3_1$.

The first temperature sensor $3_1$ provides a first temperature signal $S3_1$ that controls a first current source arrangement $4_1$, and the second temperature sensor $3_2$ provides a second temperature signal $S3_2$ that controls a second current source arrangement $4_2$. The first current source arrangement $4_1$ provides a first output current $I_1$ that is proportional to the absolute temperature T at the first position $P_1$, and the second current source arrangement $4_2$ generates a second output current $1_2$ that is proportional to the temperature difference $\Delta T$ between the temperatures at the second position $P_2$ and the first position $P_1$. In both current sources $4_1$, $4_2$ the proportionality factors between the sensed temperature T and the temperature difference $\Delta T$, respectively, can be set by first and second control signals $S5_1$, $S5_2$ received by the current source arrangements $4_1$, $4_2$, respectively.

The evaluation circuit 2 receives an input current $I_{SUM}$ that corresponds to the sum of the output currents $I_1$, $I_2$ of the current source arrangements $4_1$, $4_2$ and that is dependent on the absolute temperature T and the temperature difference $\Delta T$.

According to one embodiment, the overall temperature signal $S_{OT}$ assumes a signal level indicating that an overtemperature scenario has occurred, when the input current $I_{SUM}$ is higher than a reference value. This may result from an increase of the temperature at the second position $P_2$, so that the temperature difference $\Delta T$ increases. Such an increase of the temperature at the second position $P_2$ may, for example, result from a failure in a load connected to a power device integrated in the power device area 120 of the semiconductor body 100. The input current $I_{SUM}$ could also increase above the reference value, when the temperature at the first position $P_1$, which is out at the power device area 120 increases. Such a temperature increase may, for example, result from an increase of an ambient temperature at the location where the electronic circuit is arranged.

In the embodiment illustrated in FIG. 9, the first and second current source 63, 64 of the second temperature sensor $3_2$ are controlled current sources that are controlled by the temperature sensor $3_1$ in the first sensor circuit $1_1$, so that currents 163, 164 provided by these current sources 63, 64 are proportional to currents provided by the first and second current sources 33, 34 in the first temperature sensor $3_1$.

An embodiment of an evaluation circuit 2 having a functionality as explained before is illustrated in FIG. 10. This evaluation circuit 2 includes a resistor 21 coupled to the input terminal and receiving the input current $I_{SUM}$. The evaluation circuit 2 further includes a reference signal source 22, such as a reference voltage source, and a comparator 23. The input current $I_{SUM}$ generates a voltage drop V21 across the resistor 21, where the voltage drop increases when the input current $I_{SUM}$ increases. The reference voltage 22 provides a reference voltage V22. The comparator 23 compares the voltage V21 across the resistor 21 with the reference voltage V22 and generates the overtemperature signal $S_{OT}$ dependent on the compared result. In the embodiment illustrated in FIG. 12, the overtemperature signal $S_{OT}$ assumes a high-signal level when the voltage V21 across the resistor 21 increases to or above the reference voltage V22. In this embodiment, a high signal level of the overtemperature signal $S_{OT}$ indicates that an overtemperature scenario has occurred. In the evaluation circuit according to FIG. 10, the input current $I_{SUM}$ is compared with a fixed threshold, namely a threshold defined by the reference voltage V22 divided through the resistance of the resistor 21. The input current, however, may be dependent not only on the temperature dependent output currents $I_1$, $I_2$, $I_3$ of the individual sensor circuits $1_1$, $1_2$, $1_3$ but may also be dependent on at least one control signal that scales the individual output currents $I_1$, $I_2$, $I_3$. Assume, for example, that the threshold as defined by the reference voltage is reached when the at least one control signal has a first value and when there is a first overtemperature scenario that is associated with a first temperature value of the at least one power device, then by increasing the at least one control signal, the threshold would already be reached when there is a second overtemperature scenario that is associated with a second temperature value of the at least one power device. Thus, the at least control signal is not only suitable to adjust the weight of the individual output currents $I_1$, $I_2$, $I_3$ but is also suitable to adjust the effective threshold.

Figure 11:
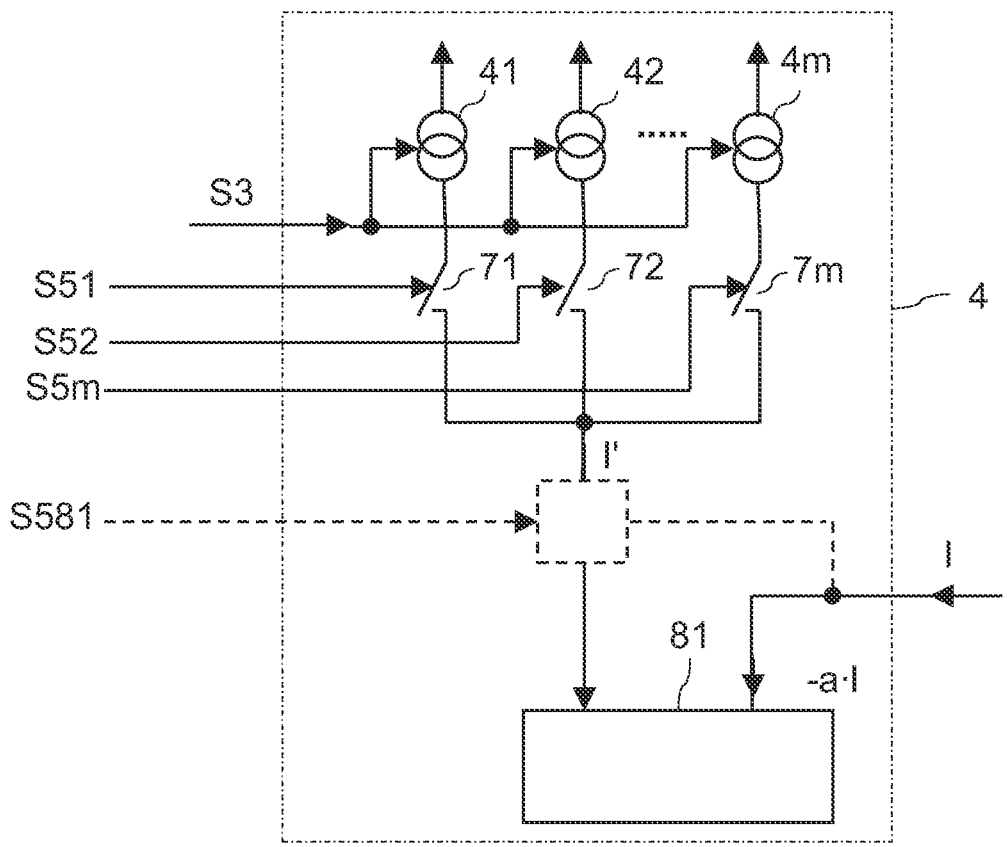
FIG. 11 illustrates an embodiment of a temperature evaluation circuit including three sensor circuits, a control circuit and an evaluation circuit.

FIG. 11 illustrates a further embodiment of a current source arrangement 4. This current source arrangement includes a current mirror 81 that receives a current I' corresponding to a sum of the currents provided by the activated current sources of the current source arrangement 4 and provides an output current I that has a direction opposite to a current flow direction of current I'. The absolute value of the output current I is proportional to the absolute value of the current I', where the current mirror provides a further means for adjusting a proportionality factor between the sensed temperature and the output current.

Optionally, the current source arrangement includes a switching circuit that is dependent on a further subsignal S581 of the control signal S5 either provides the current I' to the current mirror or bypasses the current minor, so that the current I' is provided at the output. In this current source arrangement, not only the proportionality factor between the sensed temperature and the output current I, but also the direction of the output current can be adjusted. For explanation purposes it is assumed that the output current is a positive current when the current mirror 81 is bypassed and is a negative current when the current minor provides the output current.

Providing an output current with a negative direction can be used to subtract a current from currents provided by other current source arrangements.

Figure 12:
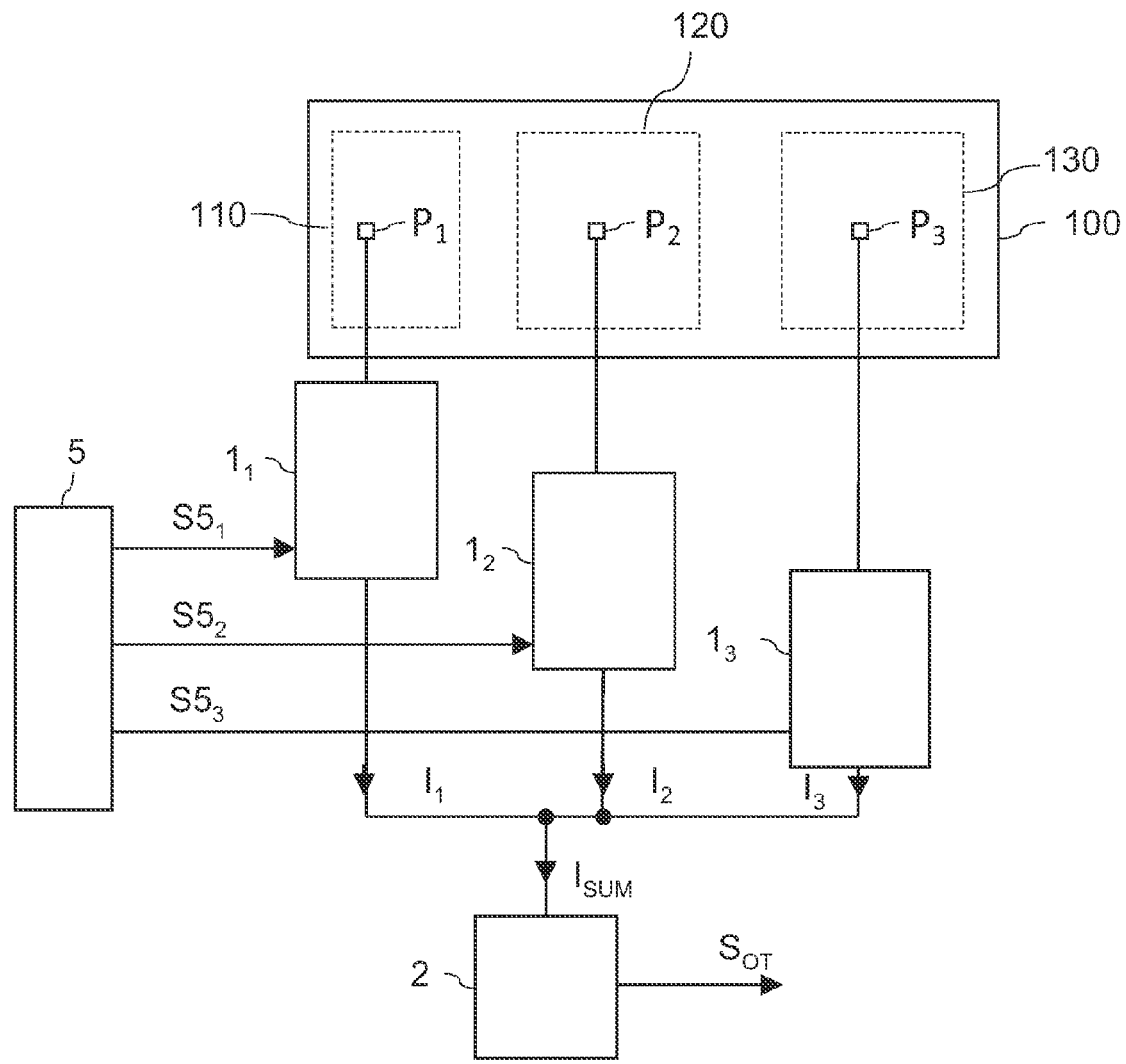
FIG. 12 illustrates an embodiment of the evaluation circuit.

FIG. 12 illustrates a further embodiment of an electronic circuit that includes an integrated circuit in a semiconductor body 100 and an evaluation circuit 2. This evaluation circuit includes three sensor circuits $1_1$, $1_2$, $1_3$. The first and second sensor circuits $1_1$, $1_2$ are, for example, implemented as explained with reference to FIG. 9, so that the first sensor circuit $1_1$ provides an output current $I_1$ that is proportional to an absolute temperature T at a first position $P_1$, and that the second sensor circuit $1_2$ provides an output current $1_2$ that is proportional to a temperature difference ΔT between temperatures at the second and first position $P_2$, $P_1$.

The third sensor circuit $1_3$ is, for example, implemented like the second sensor circuit $1_2$ and provides an output current $I_3$ that is proportional to a temperature difference ΔT between a temperature at a third position $P_3$ of the semiconductor body 100 and the first position $P_1$. The third position $P_3$ is, for example, arranged within a further power device area 130. In this case, the second sensor circuit $1_1$ and the third sensor circuit $1_3$ may have the series circuit with the first sensor element 61 and the first current source 63 (see FIG. 6) in common. In this further power device area 130 a further power device such as a further power transistor, can be implemented. The third sensor circuit $1_3$ is, for example, implemented with the current source arrangement according to FIG. 11, so that the third output current $1_3$ is a negative current, while the first and second output currents $I_1$, $I_2$ are, for example, positive output currents. By subtracting the third output current $I_3$ from the first and second output current $I_1$, $I_2$ a thermal crosstalk that the power device implemented in the further power device area 130 has on the temperature in the power device area 120 can be eliminated. Thus, the first power device may be switched off only when a high temperature of the first power device results from operation of the first power device itself but not from a high temperature of the second power device.

The electronic circuit of FIG. 12 mainly serves to evaluate the temperature of the first power device integrated in the first power device are 120, where the temperature of the second power device integrated in the second power device area, or the influence the second power device may have on the temperature of the first power device is also taken into account. In the protection method performed by the circuit of FIG. 12, the second output current $I_2$ represents a first temperature signal that is dependent on the temperature of the first power semiconductor device, and the third output current represents a second temperature signal that is dependent on the temperature of the second power semiconductor device. The input current $I_{SUM}$ of the evaluation circuit 2 represents a combined temperature signal that is a weighted sum of at least the first temperature signal and the second temperature signal. In this combined temperature signal, a first weighting factor of the first temperature signal and a second weighting factor of the second temperature signal have opposite signs. Further, an absolute value of the second weighting factor may be smaller than an absolute value of the first weighting factor. These weighting factors are represented by the control signals provided by the control circuit.

For evaluating the temperature of the second power device implemented in the second power device area 120 a circuit equivalent to the circuit of FIG. 12 can be provided, wherein in this circuit, an output corresponding to the second output current $I_2$ of FIG. 12 would be subtracted from a sum of output currents corresponding to the first and third output currents $I_1$, $I_3$ in FIG. 12. To implement the circuit according to FIG. 12 and this further circuit, six sensor circuits can be provided, wherein all the sensor circuits that sense a temperature difference between the temperature in one power device area 120, 130 can be implemented as illustrated in FIG. 6 and may have the series circuit with the first sensor element 61 and the first current source 63 (see FIG. 6) in common.

According to a further embodiment, only one first sensor circuit, such as sensor circuit $1_1$ in FIG. 12, one second sensor circuit, such as sensor circuit $1_2$ in FIG. 12, and one third sensor circuit, such as sensor circuit $1_3$ in FIG. 12, are used to protect the first and second power devices. In this case, these sensor circuits are each configured to provide two output currents instead of only one output current as illustrated in FIG. 12. Two output currents instead of one output current can be generated by providing two current source arrangements in each sensor arrangement instead of only one current source arrangement, where the two current source arrangements in one sensor circuit are controlled by a common temperature signal, such as temperature signal S3 explained before. The two output currents of each sensor circuit can be scaled or weighted independent of each other and each of the two output currents of one sensor circuit is combined with one output current of the other two sensor circuit, so as to provide a first sum current that is evaluated in order to protect the first power device and to provide a second sum current that is used to protect the second power device. The output current of the third sensor arrangement has a negative weight in the first sum current, and the output current of the second sensor arrangement has a negative weight in the second sum current.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc., and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An electronic circuit comprising a temperature evaluation circuit, the temperature evaluation circuit comprising:
    a first sensor circuit comprising a first output terminal and configured to sense a first temperature at a first position of the electronic circuit and to generate at the first output terminal a first output current that is dependent on the first temperature;
    a second sensor circuit comprising a second output terminal and configured to sense a second temperature at a second position of the electronic circuit and to generate at the second output terminal a second output current that is dependent on the second temperature; and
    an evaluation circuit comprising an input terminal connected to the first output terminal and the second output terminal and configured to provide an evaluation signal that is dependent on a current received at the input terminal, wherein the first sensor circuit further comprises:
        a first temperature sensor configured to provide a first temperature measurement signal that is dependent on the first temperature; and
        a first current source arrangement configured to receive the first temperature measurement signal and to generate the first output current dependent on the first temperature measurement signal.

2. The electronic circuit of claim 1, further comprising:
    a control circuit configured to generate a first control signal,
    wherein the first current source arrangement is configured to receive the first control signal and to generate the first output current also dependent on the first control signal.

3. The electronic circuit of claim 2, wherein the first current source arrangement further comprises:
    a first plurality of controlled current sources each receiving the first temperature measurement signal and coupled to the first output terminal; and
    an activation circuit configured to receive the first control signal and to activate or deactivate individual ones of the first plurality of controlled current sources dependent on the first control signal.

4. The electronic circuit of claim 1, wherein the first temperature sensor comprises:
    a first series circuit comprising a first sensor element, an impedance and a first controlled current source;
    a second series circuit comprising a second sensor element and a second controlled current source; and
    a control loop configured to generate a common drive signal for the first and second current sources such that a voltage drop across the series circuit with the first sensor element and the impedance corresponds to a voltage drop across the second sensor element, wherein the first temperature measurement signal is dependent on the common drive signal.

5. The electronic circuit of claim 4, wherein the first sensor element and the second sensor element each comprise a diode.

6. An electronic circuit comprising a temperature evaluation circuit, the temperature evaluation circuit comprising:
    a first sensor circuit comprising a first output terminal and configured to sense a first temperature at a first position of the electronic circuit and to generate at the first output terminal a first output current that is dependent on the first temperature;
    a second sensor circuit comprising a second output terminal and configured to sense a second temperature at a second position of the electronic circuit and to generate at the second output terminal a second output current that is dependent on the second temperature; and
    an evaluation circuit comprising an input terminal connected to the first output terminal and the second output terminal and configured to provide an evaluation signal that is dependent on a current received at the input terminal, wherein the second sensor circuit further comprises:
        a second temperature sensor configured to provide a second temperature measurement signal that is dependent on a first temperature difference; and
        a second current source arrangement configured to receive the second temperature measurement signal and to generate the second output current dependent on the second temperature measurement signal.

7. The electronic circuit of claim 6, further comprising:
    a control circuit configured to generate a second control signal,
    wherein the second current source arrangement is configured to receive the second control signal and to generate the second output current also dependent on the second control signal.

8. The electronic circuit of claim 7, wherein the second current source arrangement further comprises:
    a second plurality of controlled current sources each receiving the second temperature measurement signal and coupled to the second output terminal; and
    an activation circuit configured to receive the second control signal and to activate or deactivate individual ones of the second plurality of controlled current sources dependent on the second control signal.

9. The electronic circuit of claim 6, wherein the second temperature sensor further comprises:
    a third series circuit comprising a third sensor element and a first current source;
    a fourth series circuit comprising a fourth sensor element and a fourth current source;
    a fifth series circuit comprising a fifth current source and a further impedance and coupled to a circuit node common to the fourth sensor element and the fourth current source; and
    a control loop configured to generate a drive signal for a sixth current source such that a voltage drop across a series circuit with the further impedance and the fifth current source corresponds to a voltage drop across the third sensor element,
    wherein the second temperature measurement signal is dependent on the drive signal.

10. The electronic circuit of claim 9, wherein the third and fourth sensor elements are diodes.

11. An electronic circuit comprising a temperature evaluation circuit, the temperature evaluation circuit comprising:
    a plurality of n sensor circuits, wherein n>1, each sensor circuit comprising an output terminal and configured to sense at least one temperature and to provide an output current that is dependent on the at least one temperature; and
    an evaluation circuit comprising an input terminal connected to the output terminals of the plurality of the sensor circuits and configured to provide an evaluation signal that is dependent on a current received at the input terminal, further comprising
    a control circuit configured to generate at least one control signal,
    wherein at least one of the sensor circuits is configured to provide the output current dependent on the at least one temperature as sensed by at least one sensor element and dependent on the at least one control signal.

12. The electronic circuit of claim 11, wherein at least one of the sensor circuits comprises:
 a temperature sensor configured to generate one temperature measurement signal that is dependent on the at least one temperature; and
 a current source arrangement configured to receive the temperature measurement signal from the temperature sensor and one control signal from the control circuit and configured to provide the output current dependent on the temperature measurement signal and the at least one control signal.

13. The electronic circuit of claim 12,
 wherein the current source arrangement further comprises a plurality of controlled current sources connected in parallel and each receiving the temperature measurement signal or a signal dependent thereon; and
 an activation circuit configured to receive the at least one control signal and to activate or deactivate individual ones of the plurality of controlled current sources dependent on the at least one control signal.

14. The electronic circuit of claim 13, wherein the activation circuit comprises at least one switch connected in series with one of the plurality of controlled current sources.

15. The electronic circuit of claim 11, wherein each sensor circuit comprises at least one sensor element.

16. The electronic circuit of claim 15, wherein the at least one sensor element of each of the sensor circuits is integrated in an integrated circuit.

17. A method for protecting a first power semiconductor device integrated in a semiconductor body in which a second power semiconductor device is also integrated, the method comprising:
 providing a first temperature signal that is dependent on a temperature of the first power semiconductor device;
 providing a second temperature signal that is dependent on a temperature of the second power semiconductor device;
 forming a weighted sum of at least the first temperature signal and the second temperature signal, so as to form a combined temperature signal, wherein a first weighting factor of the first temperature signal and a second weighting factor of the second temperature signal have opposite signs;
 comparing the combined temperature signal with a threshold value; and
 switching off the first power semiconductor device dependent on a comparison result.

18. The method of claim 17, wherein an absolute value of the second weighting factor is smaller than an absolute value of the first weighting factor.

19. The method of claim 17,
 wherein the first temperature signal is dependent on a temperature difference between the temperature of the first power semiconductor device and a temperature at a given position of the semiconductor body distant to the first power semiconductor device, and
 wherein the second temperature signal is dependent on a temperature difference between the temperature of the second power semiconductor device and the temperature at the given position of the semiconductor body.

20. The method of claim 19, further comprising:
 providing a further temperature signal that is dependent on the temperature at the given position,
 wherein forming the weighted sum so as to form the combined temperature signal, comprises forming a weighted sum of the first temperature signal, the second temperature signal and the further temperature signals.

21. The method of claim 17, wherein the first and second temperature signals are current signals.

22. An electronic circuit comprising a temperature evaluation circuit, the temperature evaluation circuit comprising:
 a first sensor circuit comprising a first output terminal and configured to sense a first temperature at a first position of the electronic circuit and to generate at the first output terminal a first output current that is dependent on the first temperature;
 a second sensor circuit comprising a second output terminal and configured to sense a second temperature at a second position of the electronic circuit and to generate at the second output terminal a second output current that is dependent on the second temperature; and
 an evaluation circuit comprising an input terminal connected to the first output terminal and the second output terminal and configured to provide an evaluation signal that is dependent on a current received at the input terminal, wherein the evaluation circuit is configured to provide the evaluation signal dependent on a weighted sum of at least the first output current and the second output current received at the input terminal, wherein a first weighting factor of the first output current and a second weighting factor of the second output current have opposite signs.

23. The electronic circuit of claim 22, the evaluation circuit further comprises a comparator configured to compare the weighted sum to a threshold, wherein the evaluation signal is coupled to an output of the comparator.

24. An electronic circuit comprising a temperature evaluation circuit, the temperature evaluation circuit comprising:
 an evaluation circuit configured to
  receive a first temperature signal that is dependent on a temperature of a first power semiconductor device,
  receive a second temperature signal that is dependent on a temperature of a second power semiconductor device integrated on a same semiconductor body as the first power semiconductor device, and
  form a weighted sum of at least the first temperature signal and the second temperature signal, so as to form a combined temperature signal, wherein a first weighting factor of the first temperature signal and a second weighting factor of the second temperature signal have opposite signs; and
 a comparison circuit configured to compare the combined temperature signal with a threshold value, and switch off the first power semiconductor device dependent on a comparison result.

* * * * *